United States Patent
Seo et al.

(10) Patent No.: US 9,455,790 B2
(45) Date of Patent: Sep. 27, 2016

(54) HIGH-SPEED OPTICAL RECEIVER IMPLEMENTED USING LOW-SPEED LIGHT RECEIVING ELEMENT AND METHOD FOR IMPLEMENTING THE SAME

(71) Applicant: OE SOLUTIONS AMERICA INC., Englewood Cliffs, NJ (US)

(72) Inventors: Wan Seok Seo, Irvine, CA (US); Bong Sin Kwark, Irvine, CA (US); Moon Soo Park, Irvine, CA (US)

(73) Assignee: OE SOLUTIONS AMERICA, INC., Englewood Cliffs, NJ (US)

( * ) Notice: Subject to any disclaimer, the term of this patent is extended or adjusted under 35 U.S.C. 154(b) by 0 days.

(21) Appl. No.: 13/686,882

(22) Filed: Nov. 27, 2012

(65) Prior Publication Data
US 2014/0147110 A1    May 29, 2014

(51) Int. Cl.
*H04B 10/69* (2013.01)
*H03F 3/08* (2006.01)

(52) U.S. Cl.
CPC .......... *H04B 10/6971* (2013.01); *H03F 3/087* (2013.01); *H04B 10/6911* (2013.01); *H04B 10/6932* (2013.01)

(58) Field of Classification Search
CPC ................ H04B 10/66; H04B 10/67–10/6973
USPC .................................................. 398/202–214
See application file for complete search history.

(56) References Cited

U.S. PATENT DOCUMENTS

| | | | |
|---|---|---|---|
| 2003/0007224 A1* | 1/2003 | Yamashita et al. | 359/189 |
| 2004/0145799 A1* | 7/2004 | Sedic | 359/325 |
| 2006/0034621 A1* | 2/2006 | Denoyer | 398/208 |
| 2007/0177884 A1* | 8/2007 | Kagaya et al. | 398/202 |
| 2007/0292132 A1* | 12/2007 | Zhao et al. | 398/63 |
| 2008/0151985 A1* | 6/2008 | Chin et al. | 375/231 |
| 2008/0231945 A1* | 9/2008 | Piehler et al. | 359/337.2 |
| 2009/0315626 A1* | 12/2009 | Bowler et al. | 330/304 |
| 2010/0316391 A1* | 12/2010 | Shastri et al. | 398/141 |
| 2011/0020011 A1* | 1/2011 | Yazaki | 398/160 |
| 2012/0250795 A1* | 10/2012 | Chatwin | 375/316 |

\* cited by examiner

*Primary Examiner* — David Payne
*Assistant Examiner* — Casey Kretzer
(74) *Attorney, Agent, or Firm* — Ichthus International Law, PLLC

(57) ABSTRACT

A high-speed optical receiver implemented using a low-speed light receiving element is provided, which is configured to receive an optical signal having a higher transmission rate than that received using a general avalanche photo diode (APD) by expanding a frequency bandwidth using a receiver circuit configured together with an APD in the optical receiver including the APD, an APD bias control circuit, a transimpedance amplifier (TIA) for amplifying a signal received from the APD to have low noise, and a post amplifier; and a method of implementing such a high-speed optical receiver.

8 Claims, 7 Drawing Sheets

HIGH-SPEED OPTICAL RECEIVER IMPLEMENTED USING LOW-SPEED LIGHT RECEIVING ELEMENT AND METHOD FOR IMPLEMENTING THE SAME

FIELD OF THE INVENTION

Present embodiments of the invention relate to optical data communications, and more particularly to optical transmission systems and methods having a high-speed optical receiver implemented using a low-speed light receiving element.

BACKGROUND

Attempts have been made to maximize reception sensitivity of an optical receiver using an avalanche photo diode (APD) in a transmission system. APDs that sufficiently secure a required APD gain and bandwidth are used as the APD in the transmission system. Therefore, it was unnecessary to worry about the bandwidth of the APD when the optical receiver is implemented. Accordingly, existing inventions focus on configurations for maximizing characteristics of the APD.

For example, techniques include configurations for APD bias control, such as APD bias control for controlling gain of the APD and for improving the signal-to-noise (S/N) ratio of a received signal. Other techniques include compensation circuit for forming an optimal APD bias according to temperature, employing a method of controlling the APD bias by storing an optimal APD voltage in a read-only memory (ROM), searching for an optimal APD bias using a thermistor, and an APD bias circuit for preventing an APD from being damaged when a large amount of light is input to the APD because gain is obtained in photoelectric conversion. Still other techniques include calibration of a photoelectric element using the breakdown voltage of the APD.

As a transmission rate of optical transmission systems is increased to 10 Gb/s or more, and use of smart devices is rapidly increasing, the transmission capacity or transmission rate of optical transmission networks has recently been increased in order to catch up with the rate of traffic increase. In a light communication system, an optical receiver is necessarily used to receive an optical signal transmitted. In a case where it is necessary to transmit light over a long distance or in a case where a large light link margin is required, the light receiver uses an APD that improves its characteristics by amplifying a photoelectric converted signal. In the optical receiver, an APD having a sufficient bandwidth suitable for a required transmission rate is used, thereby maximizing characteristics of the APD. It is difficult to catch up with the recent increase in transmission rate and to manufacture a high-speed APD. It is desirable to have an optical transmission system that overcomes such difficulties.

BRIEF SUMMARY

The present invention relates to a high-speed optical receiver implemented using a low-speed light receiving element, which is configured to receive an optical signal having a higher transmission rate than that received using a general avalanche photo diode (APD) by expanding a frequency bandwidth using a receiver circuit configured together with an APD in the optical receiver including the APD, an APD bias control circuit, a transimpedance amplifier (TIA) for amplifying a signal received from the APD to have low noise, and a post amplifier; and a method of implementing the same.

An aspect of preferred embodiments of the invention is to provide a high-speed optical receiver of 10 Gb/s by adding a frequency characteristic compensation circuit using a low-speed APD used in EPON or GPON, e.g., an APD used in 2.5 Gb/s or low-speed transmission.

Another aspect of preferred embodiments of the invention is to provide a high-speed optical receiver that satisfies the standard of reception sensitivity required in an optical receiver for 10 Gb/s PON by adding a frequency characteristic compensation circuit and adjusting the bias voltage of an APD.

A further aspect of preferred embodiments of the invention is to provide a high-speed optical receiver that satisfies the standard of reception sensitivity by methods such as adding a frequency characteristic compensation circuit, adjusting the bias voltage of an APD, and adding a software-type optimal adjustment means, and the like.

According to an aspect of preferred embodiments of the invention, a high-speed optical receiver includes an APD, as a light receiving element, for receiving light transmitted at a speed of 2.5 Gb/s or a low speed, a TIA for amplifying current converted by the APD, a frequency characteristic compensation circuit expanding a frequency bandwidth so as to receive a signal transmitted at high speed, and a post amplifier for amplifying the signal to a signal with an amplitude available in a digital element.

According to another aspect of preferred embodiments of the invention, an implementation method of a high-speed optical receiver using an APD of a speed of 2.5 Gb/s or a low speed includes: measuring a gain and frequency characteristic from a circuit comprising an APD or PIN diode, as a light receiving element, for receiving light transmitted at a speed of 2.5 Gb/s or a low speed, a TIA placed at the next end of the APD or PIN diode and amplifying converted current to have low noise, and a post amplifier for amplifying a signal to a signal with an amplitude available in a digital element; and adding a frequency characteristic compensation circuit having a gain and frequency bandwidth in which data is transmitted at a rate of 5 Gb/s to 10 Gb/s when frequency compensation is performed based on the measured gain and frequency characteristics.

According to a further aspect of preferred embodiments of the invention, a high-speed optical receiver has an optimal gain and frequency bandwidth by adjusting the bias voltage of an APD and the frequency bandwidth of a frequency characteristic compensation circuit.

According to yet another aspect of preferred embodiments of the invention, there is provided a high-speed optical receiver in which a frequency characteristic compensation circuit is added by preferably positioning an additional circuit between a TIA for amplifying the signal received from an APD or PIN diode in order to have the low noise, and a post amplifier for amplifying the signal available as a digital signal, by positioning the additional circuit at a rear end of the TIA, or by positioning the additional circuit at a front end of the post amplifier.

DETAILED DESCRIPTION

Figure 1:
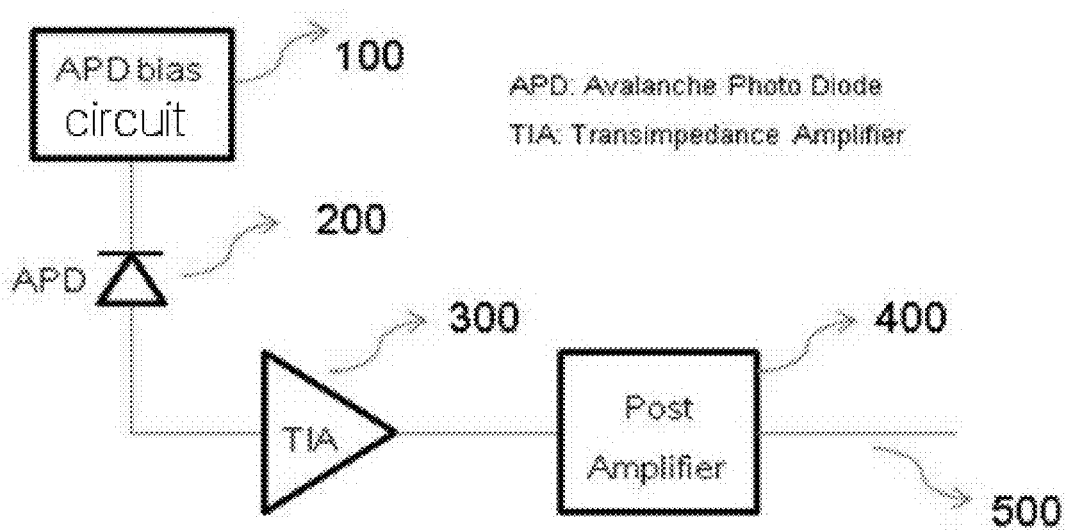
FIG. 1 is a block diagram of a general optical receiver using an APD, according to aspects of preferred embodiments.

Exemplary embodiments of the present invention will now be described in detail with reference to the accompanying drawings.

In general, an optical receiver using an APD has been used to increase reception sensitivity. Prior transmission systems have a relatively low transmission rate. Most recent transmission systems have a transmission rate of 10 Gb/s.

With the increase in traffic due to smart devices, 40 Gb/s or 100 Gb/s transmission systems have recently been developed. However, in the light transmission method used in client-side, 40 Gb/s or 100 Gb/s transmission systems, most transmission systems are based on a transmission rate of 10 Gb/s. Therefore, light receiving elements practically used in optical receivers receive an optical signal at 10 Gb/s.

With 100 Gb/s line-side optical receivers, i.e., optical receivers for long-distance transmission employ a coherent method, it is unnecessary for the optical receivers to use an element such as an APD. The maximum speed of APDs that have been commercialized to date is 10 Gb/s.

All of the aforementioned approaches use circuits having a sufficiently wide bandwidth of APDs, and thus the bandwidth of the APDs has no influence on the design of the circuits at a desired transmission rate. This is because all designs are focused on obtaining the maximum performance in existing transmission equipment.

However, as light transmission technologies are used even in the end of a network, such as an optical subscriber application with the development of light transmission technologies, a cost of a light receiving element in a device is increased. Hence, cost of a light receiving element used in an optical network unit (ONU) is high for equipment such as a 10 Gb/s passive optical network (PON), which becomes an obstacle to introduction of 10 Gb/s PONs. Accordingly, if the cost of an optical receiver is lowered by implementing the function of the optical receiver usable by the 10 Gb/s PON using a low-cost light receiving element, it will be helpful to introduce a high-speed, large-capacity PON system in an initial stage. Meanwhile, existing GPONs or EPONs have already been used all over the world, and the cost of the light receiving elements is considerably lowered due to the use of a large quantity of light receiving elements.

One characteristic of the APD for 10 Gb/s transmission, to which attention should be paid, is that an operating temperature range of the APD should be −40° C. to +85° C. as an industrial operating temperature range so that the APD is used in subscriber terminals. However, although the operating temperature characteristics of the APD for 10 Gb/s transmission are being overcome, it is not easy to mass-produce the APD for 10 Gb/s transmission at as high a yield as the APD that can be used in the 10 Gb/s PONs. Such a problem makes it difficult to lower the cost of the APD.

In order to overcome such a problem, in preferred embodiments of the invention, a high-speed optical receiver, e.g., a 10 Gb/s optical receiver, has been implemented using a low-speed APD, e.g., a 2.5 Gb/s APD, used in the EPON or GPON.

It has been experimentally verified that the optical receiver implemented according to the present invention satisfies the reception sensitivity standard required in optical receivers for 10 Gb/s PON. Hereinafter, specific embodiments of the present invention will be described.

FIG. 1 is a block diagram showing an optical receiver.

In FIG. 1, if a transmitted optical signal is incident onto an APD 200 that is a light receiving element, the incident light is first converted into current in the APD 200. The current is configured with bits of '1' and '0' such as a digital signal contained in the incident signal.

Most conventional techniques were designed so that the APD obtains maximum gain while maintaining an optimal signal-to-noise (S/N) ratio depending on a voltage applied to the APD, particularly when incident light is converted into current.

A TIA 300 is an amplifier that functions to amplify the current converted in the APD 200 to have low noise. The output of the TIA 300 is again amplified by a post amplifier 400. Since an output 500 is applied to a digital element such as a serializer and deserializer (SERDES) of a line card, the output 500 is necessarily amplified to the amplitude of the digital signal. In order for the APD 200 to obtain a gain in an APD bias circuit (100), the APD can be normally operated by applying a voltage of 30-70V or so that is much higher than the power supply voltage of the optical receiver. Therefore, the APD bias circuit 100 functions to amplify the power supply voltage of the optical receiver from a general voltage of 3.3V or so to a required voltage through a DC-DC converter. The functions of components of the optical receiver have been illustrated so far.

Next, frequency characteristics of the optical receiver will be considered from the viewpoint of transmission characteristics. For the amplifier portion of the optical receiver composed of the APD 200, TIA 300 and the post amplifier 400 corresponding to the transmission rate of the input optical signal, the optical receiver is generally designed so that the frequency characteristic of the entire amplifier portion has a bandwidth of about 70 to 75% of the transmission rate.

Since the APD 200, the TIA 300 and the post amplifier 400 are consecutively connected, the frequency characteristic of each amplifier should be wider than the frequency characteristic of 70 to 75%. Accordingly, a desired frequency bandwidth is obtained when the APD 200, the TIA 300 and the post amplifier 400 are interconnected.

In order to obtain a sufficient bandwidth for 10 Gb/s transmission as described above, the APD 200 has a bandwidth of at least 7 or 8 GHz so as to be used in a 10 Gb/s optical receiver. However, sufficiently lowering a cost of the super-high speed APD for 10 Gb/s has not been prepared yet due to manufacturing difficulty and the like.

A technical method that can be used in an optical receiver having a faster transmission rate using a sufficiently low-cost APD is provided, and the principle of the method will be described.

The method of expanding the limited bandwidth of the APD may be divided into two so as to be used in the optical receiver having the faster transmission rate.

Figure 2:
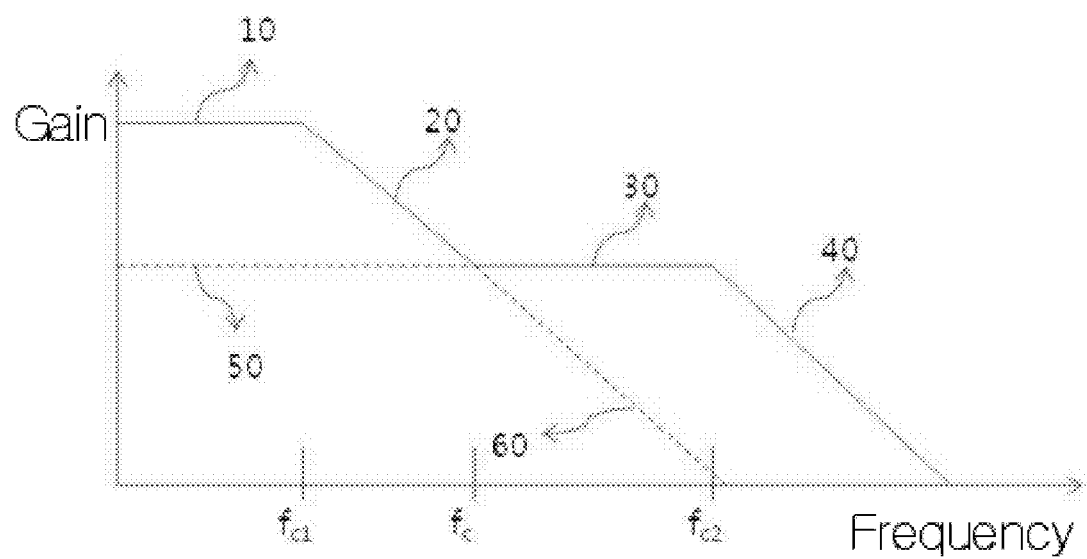
FIG. 2 illustrates a frequency characteristic when a 2.5 Gb/s APD is applied to a circuit for 10 Gb/s, according to aspects of preferred embodiments.

The principle of the first method, according to aspects of preferred embodiments, will be described with reference to FIGS. 2, 3 and 4. FIG. 2 illustrates frequency characteristics when the APD 200 for 2.5 Gb/s transmission is connected to the TIA 300 and the post amplifier 400, used for 10 Gb/s transmission. Here, a frequency characteristic of the APD for 2.5 Gb/s is shown, which is composed of a graph consisting of graph line portions 10, 20 and 60. A frequency characteristic of the TIA and the post amplifier are also shown, which is composed of a graph consisting of graph line portions 30, 40 and 50. The entire frequency characteristic becomes a graph consisting of graph line portions 10, 20, 30 and 40 obtained by combining the graphs of the two frequency characteristics.

Figure 3:
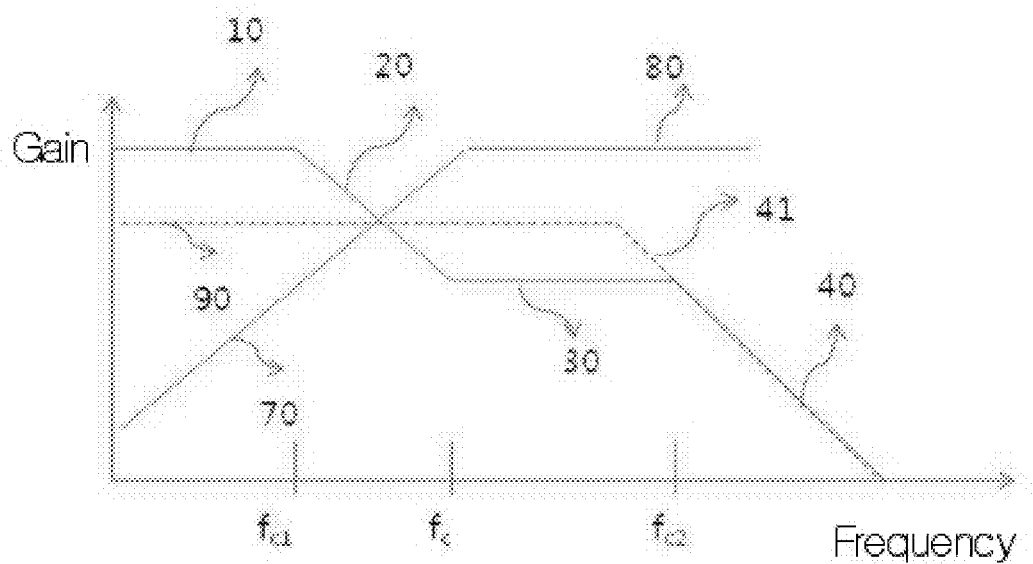
FIG. 3 illustrates frequency characteristics when the 2.5 Gb/s APD is applied to the circuit for 10 Gb/s, frequency characteristics of a frequency characteristic compensation circuit for frequency characteristic extension, and final frequency characteristics after frequency characteristic compensation, according to aspects of preferred embodiments.
Figure 5:
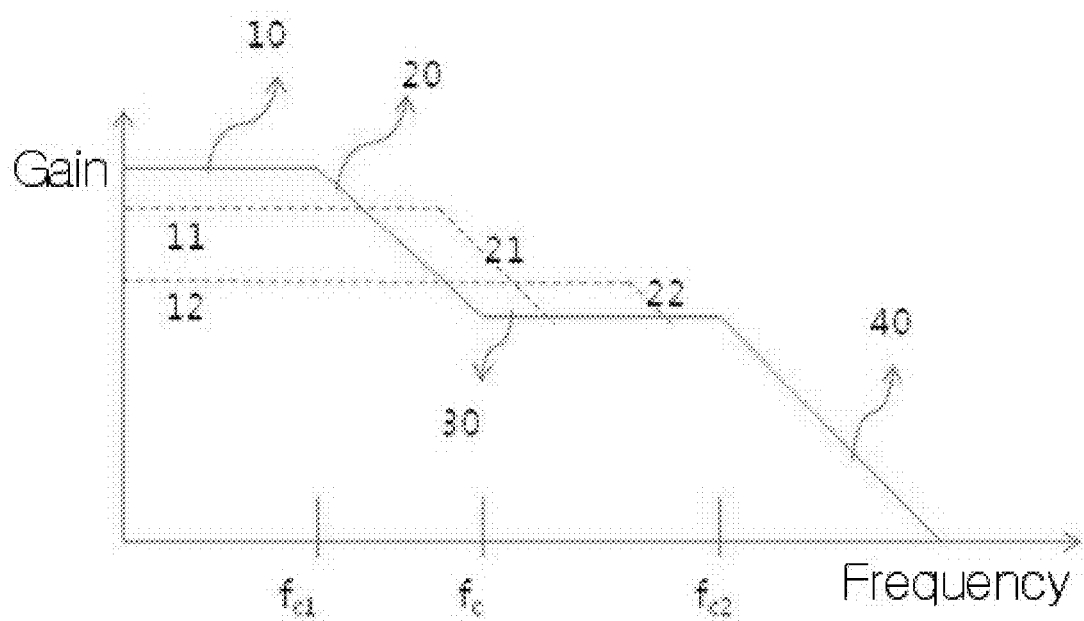
FIG. 5 illustrates a method of compensating for a frequency characteristic using the bias voltage of an APD, according to aspects of preferred embodiments.

The entire frequency characteristic of the optical receiver should have a bandwidth of $f_{c2}$, as shown in FIGS. 2, 3 and 5, so as to be used for 10 Gb/s transmission. However, the slope of the graph 20 is shown due to the frequency characteristic of the low-speed APD. For this reason, the entire frequency characteristic is not flat. With reference to FIG. 3, the graph having such a frequency characteristic can be flat while having a sufficient gain by additionally providing the optical receiver with a frequency characteristic compensation circuit having a frequency characteristic composed of a graph consisting of graph line portions 70 and 80.

The final frequency characteristic obtained by adding the frequency characteristic of the graph consisting of graph line portions 70 and 80 is composed of a graph consisting of graph line portions 90 and 41, and the bandwidth of the frequency characteristic becomes $f_{c2}$.

Theoretically, the final bandwidth will be slightly narrower than $f_{c2}$, but a desired bandwidth can be obtained using the post amplifier having a slightly wider bandwidth. When the optical receiver is practically implemented, there is no problem in use of the optical receiver, although the value of $f_{c2}$ slightly fluctuates.

Figure 4:
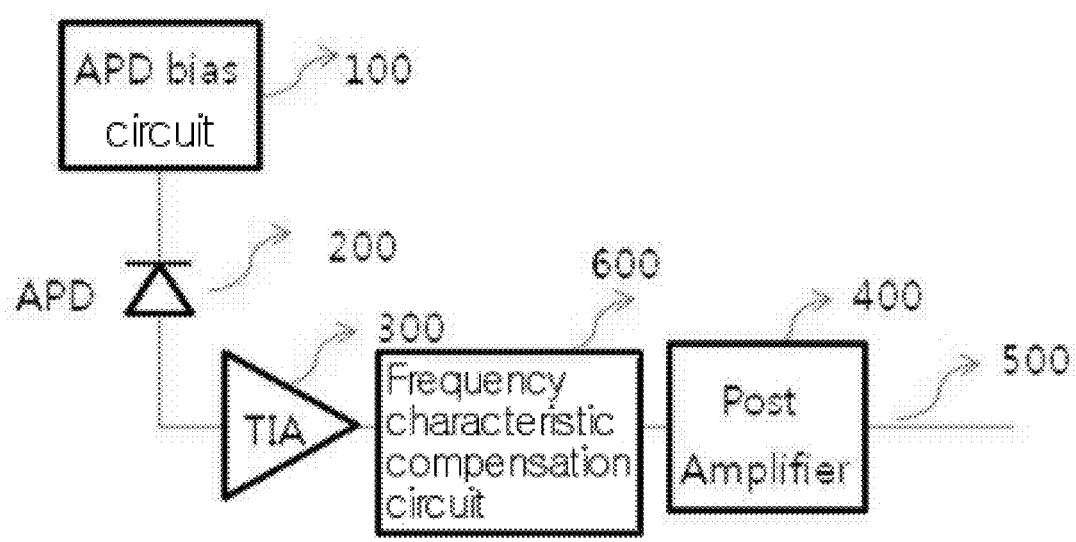
FIG. 4 is a block diagram of an optical receiver including a frequency characteristic compensation circuit, according to aspects of preferred embodiments.

FIG. 4 is a block diagram of an optical receiver obtained by adding a frequency characteristic compensation circuit to the circuit of the general optical receiver of FIG. 1. In FIG. 4, the frequency characteristic compensation circuit 600 for compensating for a frequency characteristic is positioned between the TIA 300 and the post amplifier 400. The reason for this is described below.

The TIA 300 that is a low-noise amplifier improves reception sensitivity by amplifying the fine current converted in the APD 200 so as to have low noise. Since the post amplifier 400 functions to increase the amplitude of the output signal of the TIA 300 to a logic level, the frequency characteristic compensation circuit 600 is preferably positioned between the TIA 300 and the post amplifier 400.

In the method of implementing the configuration of the frequency characteristic compensation circuit 600 having such a function, the function may be implemented in several ways. When the TIA 300 is developed by incorporating the frequency characteristic compensation circuit 600 into a portion of the TIA 300. Alternatively, the function may be implemented by incorporating the frequency characteristic compensation circuit 600 into the front portion of the post amplifier 400 as a portion of the post amplifier 400. As still another method, the function of the frequency characteristic compensation circuit 600 may be separately implemented as an independent circuit from the TIA 300 and the post amplifier 400.

Ultimately, the TIA 300, the frequency characteristic compensation circuit 600 and the post amplifier 400 are connected, starting with the APD 200 that is a light receiving element, so as to operate as one amplifier. Therefore, all of them may be combined to be considered as one amplifier of the optical receiver.

The second method is a method using a relation between the gain and bandwidth of the APD 200. Generally, it is known that the multiplication of the gain (G) by the bandwidth (BW) of the APD yields a constant. This is expressed by the following Formula 1.

$$G \times BW = \text{constant} \tag{1}$$

For example, it is assumed that the value of Formula 1 is 30 GHz or so in the APD for 2.5 Gb/s, and the value of Formula 1 is 100 GHz or so. If the gains of 2.5 Gb/s and 10 Gb/s APDs that obtain the optimal reception sensitivity at its transmission rate are 10 or so, the bandwidths of the 2.5 Gb/s and 10 Gb/s APDs become 2.5 GHz or so and 10 GHz or so, respectively.

If the bias voltage of the APD is gradually lowered from the optimal value, the gain of the APD is gradually decreased, and the bandwidth of the APD is gradually increased. For example, if the gains of the APDs for 2.5 Gb/s and 10 Gb/s are lowered to 5 or so, the bandwidths thereof become 5 GHz and 20 GHz, respectively.

In FIG. 5, a graph consisting of graph line portions 10, 11 and 12 shows a gradually decreased gain, and accordingly, a graph consisting of graph line portions 20, 21 and 22 shows a gradually increased bandwidth. If the bias voltage of the APD is adjusted as described above, the gain of the APD is decreased, but the bandwidth of the APD can be increased. Thus, the APD optimized for a low transmission rate may be used as the optical receiver capable of receiving light at a high transmission rate.

In such a technical configuration, the optical receiver suitable for a high transmission rate may be implemented by expanding the width of the APD, but the reception sensitivity tends to gradually deteriorate due to decrease in the gain of the APD. Therefore, the technical configuration is advantageous to some degree, but is not appropriate to obtain optimal reception sensitivity at a high transmission rate using the APD optimized at a low transmission rate.

In addition, the method of expanding the bandwidth of the APD by decreasing the bias voltage of the APD according to Formula 1 and FIG. 5 does not exactly correspond to Formula 1. If the bias voltage of the APD is lowered, the capacitive component of the APD is increased, and therefore, the effect of bandwidth extension is reduced. Since noise increases due to the capacitive component shown at the input terminal of the TIA 300, the reception sensitivity tends to be deteriorated. Generally, noise power is increased in proportion to the square of the capacitive element equivalently shown at the input terminal of TIA 300. Therefore, the method of expanding the bandwidth of the APD by decreasing only the bias voltage of the APD does not provide an optimal result.

The method of obtaining optimal reception sensitivity is the first method described above, which is to compensate for the entire frequency characteristic of the optical receiver to have a frequency band suitable for a required high transmission rate using the frequency characteristic compensation circuit while maintaining the bias voltage of the APD 200 optimized at the low transmission rate as the applied state. In order to use the technical configuration, the optical receiver is preferably configured to be easily compensated with an appropriate value when the optical receiver is practically implemented, by adding a programmable function to the frequency characteristic compensation circuit. Accordingly, in a case where characteristics of the APD are slightly different, fine regulation is possible.

In another technical configuration, the APD may obtain a final frequency characteristic by slightly adjusting the bias voltage of the APD while maintaining the frequency characteristic compensation circuit at an appropriate value.

In a case where the optical receiver is practically produced as a product, the best result can be obtained using both methods, i.e., the method of designing and manufacturing the optical receiver so that the frequency characteristic of the APD can be varied by programming the frequency characteristic and the method of adjusting the bandwidth of the APD by adjusting the bias voltage of the APD.

Practically, it was confirmed through experimentation whether or not the principle described above is correctly applied. A 10 Gb/s optical receiver was manufactured using an APD for 2.5 Gb/s. In FIG. 4, the APD for 2.5 Gb/s was used as the APD 200, and a TIA for 10 Gb/s was used as the TIA 300. An element in which the two functions of the frequency characteristic compensation circuit 600 and the post amplifier 400 were integrated was used as the frequency characteristic compensation circuit 600 and the post amplifier 400. The integrated frequency characteristic compensation circuit was linked with a program, thereby providing a function and means that can finely adjust a degree of frequency compensation.

The APD applies a bias voltage for obtaining optimal reception sensitivity at 2.5 Gb/s so that the optical receiver configured as described above could obtain the optimal reception sensitivity at 10 Gb/s. Then, the frequency characteristic was compensated using the programmable frequency characteristic compensation circuit.

First, it was confirmed whether or not the optical receiver having the frequency characteristic compensated in such a manner could receive a 10 Gb/s optical signal. After it was confirmed that the optical receiver could receive the 10 Gb/s optical signal, the frequency characteristic compensation circuit was finely adjusted to obtain optimal reception sensitivity while changing a degree of frequency compensation. Then, optimal frequency compensation was performed by finely adjusting the bias voltage of the APD.

Figure 6:
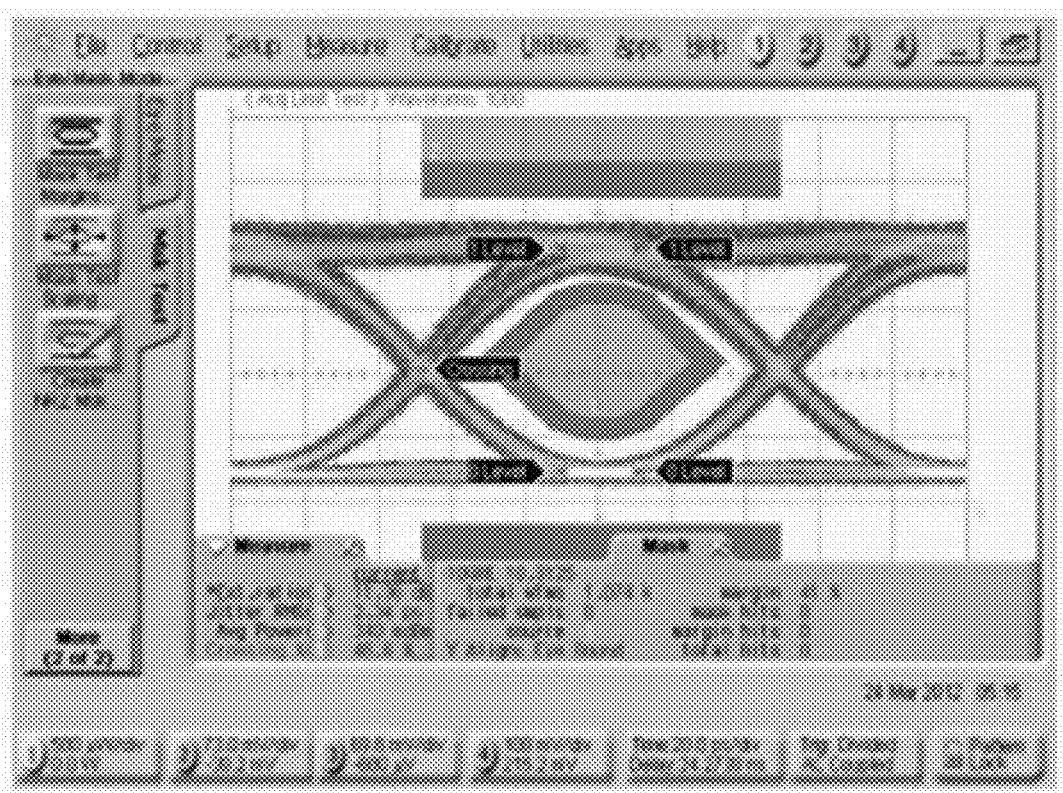
FIG. 6 illustrates a light characteristic of a reference optical receiver for measuring reception sensitivity, according to aspects of preferred embodiments.

The waveform of a reference optical transmitter used to confirm the characteristic of the implemented optical receiver is shown as a result of FIG. 6. The extinction ratio of the used optical transmitter is 11.3 dB, and the transmission rate of the used optical transmitter is 10.3 Gb/s.

Figure 7:
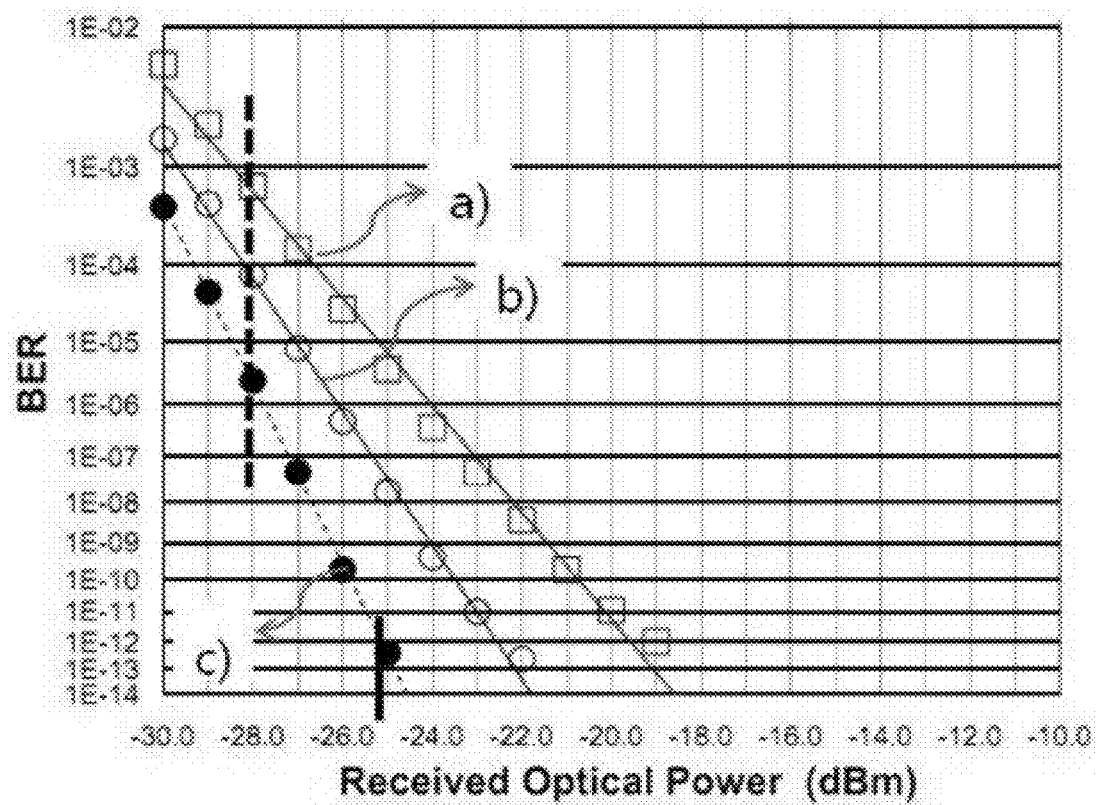
FIG. 7 illustrates a bit error rate (BER) characteristic of a 10 Gb/s optical receiver using a post amplifier including a 2.5 Gb/s APD, a 10 Gb/s TIA and a frequency characteristic compensation circuit, according to aspects of preferred embodiments.

FIG. 7 shows characteristics of the 10 Gb/s optical receiver, measured using the reference optical transmitter. In FIG. 7, graphs a), b) and c) show that their bit error rate (BER) characteristics differ depending on a compensation degree of the frequency characteristic compensation circuit. The graph c) is a BER graph in an optimal frequency compensation state. In the graph c), it can be seen that when the BER is $10^{-12}$, the reception sensitivity is better than −25 dBm. The performance is the same level as the characteristic of the optical receiver using a general APD for 10 Gb/s. In the 10G PON, the standard of the reception sensitivity is specified as −28 dBm at a BER of $10^{-3}$. This is because a forward error correction (FEC) function is used in the 10 G PON. In FIG. 7, it can be seen that all the graphs a), b) and c) satisfy the performance. For reference, it was confirmed that when the reception sensitivity was measured at a transmission rate of 2.5 Gb/s using a 2.5 Gb/s optical receiver through the configuration describe above, the measured reception sensitivity was better than −29 dBm.

As shown in FIG. 7, it can be seen that the optical receiver can be implemented to provide the reception sensitivity obtained using a 10 Gb/s APD, using an APD for 2.5 Gb/s, an electronic circuit for 10 Gb/s and a frequency characteristic compensation circuit.

In the principle of the optical receiver using the frequency characteristic compensation circuit described above, the optical receiver may be used to simultaneously receive burst optical data of 1.25 Gb/s, 2.5 Gb/s and 10 Gb/s using an optical receiver for optical line termination (OLT) used in the 10 G PON.

The principle described above can be applied not only to an optical receiver using an APD but also to a PIN light receiving element.

That is, a high-speed optical receiver can be implemented using a low-speed, low-cost PIN light receiving element through the same technical configuration as the APD described above.

The configuration of the optical receiver according to the preferred embodiments of the invention will be generally described in brief.

The optical receiver for receiving light as data may include an APD or PIN diode acting as a light receiving element and receiving light transmitted at low speed; a TIA placed at the next end of the APD or PIN diode, for amplifying converted current to have low noise; a frequency characteristic compensation circuit expanding a frequency bandwidth so as to receive a signal transmitted at a high speed; and a post amplifier for amplifying the signal output through the frequency characteristic compensation circuit to a signal with an amplitude usable by a digital element.

Various modifications and applications are possible based on the configuration of the optical receiver. The modifications and applications can be made thereto within the technical spirit and scope of the present invention.

The optical receiver described above may be implemented by the method described as follows for implementing a high-speed optical receiver using a low-speed APD.

More specifically, the method of implementing a high-speed optical receiver using a 2.5 Gb/s APD includes measuring a gain and frequency characteristic from a circuit, wherein the circuit comprises an APD or PIN diode acting as a light receiving element and receiving light transmitted at low speed, a TIA placed at the next end of the APD or PIN diode, for amplifying converted current to have low noise, and a post amplifier for amplifying a signal to a signal with an amplitude usable by a digital element; and adding a frequency characteristic compensation circuit having a gain and frequency bandwidth in which data is transmitted at a rate of 5 Gb/s to 10 Gb/s when frequency compensation is performed based on the measured gain and frequency characteristics.

The frequency characteristic compensation circuit may be configured by positioning an additional circuit between the TIA for amplifying the signal received from the APD or PIN diode to have low noise and the post amplifier for amplifying the signal usable as a digital signal, by positioning the additional circuit at a rear end of the TIA, or by positioning the additional circuit at a front end of the post amplifier.

In the method, the high-speed optical receiver may adjust the frequency bandwidth by simultaneously performing adjustment of the frequency bandwidth using the frequency characteristic compensation circuit and adjustment of the bias voltage of the APD or PIN diode.

In the method, the optical receiver operates in a continuous reception mode in which the light is continuously received as optical signals.

In the method, the optical receiver operates in a burst mode of OLT so as to be used in a PON.

According to the present invention, it is possible to provide a high-speed optical receiver of 10 Gb/s by adding a frequency characteristic compensation circuit using a low-speed APD used in an EPON or GPON, e.g., an APD used in 2.5 Gb/s or low-speed transmission.

Further, it is possible to provide a high-speed optical receiver that satisfies the standard of reception sensitivity required in an optical receiver for 10 Gb/s PON by adding a frequency characteristic compensation circuit and adjusting the bias voltage of an APD.

Furthermore, it is possible to provide a high-speed optical receiver that satisfies the standard of reception sensitivity by adding a frequency characteristic compensation circuit, adjusting the bias voltage of an APD, adding a software-type optimal adjustment means, and the like.

Further, it is possible to provide a high-speed optical receiver implemented using a low-speed light receiving element and its implementation method, which is configured to receive an optical signal having a higher transmission rate than that received using a general APD by expanding a frequency bandwidth using a receiver circuit configured together with an APD in the optical receiver including the APD, an APD bias control circuit, a TIA for amplifying a signal received from the APD to have low noise, and a post amplifier, thereby providing a high transmission rate at low cost.

It should be understood that the embodiments and the accompanying drawings have been described for illustrative purposes, and the present invention is limited only by the following claims. Further, those skilled in the art will appreciate that various modifications, additions and substitutions can be made without departing from the scope and spirit of the invention, which are limited only by the accompanying claims and equivalents thereof.

What is claimed is:

1. A high-speed optical receiver for receiving light as an optical signal, the high-speed optical receiver having an overall bandwidth and a frequency characteristic configured to support a high data transmission rate, the high-speed optical receiver comprising:
   an avalanche photo diode (APD) or PIN diode having a bias voltage and a bandwidth, acting as a light receiving element configured to receive light and convert the received light to a current, at a data transmission rate;
   a transimpedance amplifier (TIA) configured to receive and amplify the current of the APD or PIN diode to have low noise as a TIA output signal;
   a frequency characteristic compensation circuit configured to:
   receive the TIA output signal;
   compensate for the frequency characteristic of the high-speed optical receiver such that the frequency characteristic of the high-speed optical receiver becomes substantially flat over the overall bandwidth capable of supporting a high data transmission rate of above 5 Gb/s; and
   output a compensated output signal; and
   a post amplifier configured to receive and amplify the compensated output signal to a signal with an amplitude usable by a digital element,
   wherein:
   the bias voltage of the APD or PIN diode is adjusted to a predetermined value so as to expand the bandwidth of the APD or PIN diode substantially close to the overall bandwidth of the high-speed optical receiver, and
   the frequency characteristic compensation circuit is controlled to provide a substantially flat frequency characteristic of the high-speed optical receiver by providing frequency compensation over the overall bandwidth of the high-speed optical receiver, while maintaining the bias voltage of the APD or PIN diode at the predetermined value.

2. The high-speed optical receiver according to claim 1, wherein the frequency characteristic compensation circuit comprises an additional circuit at a rear end of the TIA, or the additional circuit at a front end of the post amplifier.

3. The high-speed optical receiver according to claim 1, wherein:
   the frequency characteristic compensation circuit includes a programmable portion; and
   the programmable portion of the frequency characteristic compensation circuit is controlled by a computer control program to finely adjust a degree of frequency compensation.

4. The high-speed optical receiver according to claim 1, wherein the TIA has a data transmission rate of substantially 10 Gb/s.

5. The high-speed optical receiver according to claim 4, wherein the APD or PIN diode has a data transmission rate of substantially 2.5 Gb/s.

6. The high-speed optical receiver according to claim 1, wherein the high-speed optical receiver is configured to operate in a passive optical network (PON).

7. The high-speed optical receiver according to claim 1, wherein the high-speed optical receiver is configured to operate either in an optical network unit (ONU) or an optical line terminal (OLT).

8. The high-speed optical receiver according to claim 7, wherein the high-speed optical receiver is configured to operate in either a continuous reception mode or a burst reception mode in which the high-speed optical receiver receives optical signals.

* * * * *